US011261541B2

(12) United States Patent
Fujikawa (10) Patent No.: US 11,261,541 B2
(45) Date of Patent: Mar. 1, 2022

(54) SHIELDING MEMBER AND APPARATUS FOR SINGLE CRYSTAL GROWTH

(71) Applicant: SHOWA DENKO K.K., Tokyo (JP)

(72) Inventor: Yohei Fujikawa, Hikone (JP)

(73) Assignee: SHOWA DENKO K.K., Tokyo (JP)

( * ) Notice: Subject to any disclaimer, the term of this patent is extended or adjusted under 35 U.S.C. 154(b) by 49 days.

(21) Appl. No.: 16/532,794

(22) Filed: Aug. 6, 2019

(65) Prior Publication Data
US 2020/0048793 A1  Feb. 13, 2020

(30) Foreign Application Priority Data

Aug. 8, 2018  (JP) .............................. JP2018-149281

(51) Int. Cl.
C30B 23/06  (2006.01)
C30B 35/00  (2006.01)
C30B 29/36  (2006.01)

(52) U.S. Cl.
CPC ............ C30B 35/007 (2013.01); C30B 23/06 (2013.01); C30B 29/36 (2013.01)

(58) Field of Classification Search
CPC ......... C30B 23/00; C30B 23/06; C30B 29/36; C30B 35/00
See application file for complete search history.

(56) References Cited

U.S. PATENT DOCUMENTS

| 2,854,364 A * | 9/1958 | Lely ........................ C30B 23/00 117/84 |
| 9,222,197 B2 * | 12/2015 | Matsuse .................. C30B 23/06 |
| 9,915,011 B2 * | 3/2018 | Fujimoto ................ C30B 23/00 |
| 2012/0225004 A1 * | 9/2012 | Zwieback ............... C30B 29/36 423/345 |
| 2013/0320275 A1 * | 12/2013 | Zwieback .............. H01B 3/025 252/512 |

FOREIGN PATENT DOCUMENTS

| JP | 08-295595 | * 11/1996 |
| JP | 11-255597 A | 9/1999 |
| JP | 2000-044383 A | 2/2000 |
| JP | 2000-264795 A | 9/2000 |
| JP | 2009-023879 A | 2/2009 |

OTHER PUBLICATIONS

Office Action dated Jan. 25, 2021 from the China National Intellectual Property Administration in CN Application No. 201910698737.8.

* cited by examiner

*Primary Examiner* — Robert M Kunemund
(74) *Attorney, Agent, or Firm* — Sughrue Mion, PLLC (57) ABSTRACT

A shielding member placed between a SiC source loading portion and a crystal installation portion in an apparatus for single crystal growth, including a crystal growth container including the loading portion which accommodates a SiC source in an inner bottom portion; a crystal installation portion facing the loading portion, and a heating unit configured to heat the crystal growth container. The device grows a single crystal of the SiC source on a crystal installed on the crystal installation portion by sublimating the SiC source from the loading portion. The shielding member includes a plurality of shielding plates, wherein each area of the plurality of shielding plates is 40% or less of a base area of the crystal growth container. When the SiC source loading portion is filled with a SiC source, a shielding ratio provided by a projection surface of the plurality of shielding plates is 0.5 or more.

20 Claims, 6 Drawing Sheets

SHIELDING MEMBER AND APPARATUS FOR SINGLE CRYSTAL GROWTH

BACKGROUND OF THE INVENTION

Field of the Invention

The present invention relates to a shielding member and an apparatus for single crystal growth.

Priority is claimed on Japanese Patent Application No. 2018-149281, filed on Aug. 8, 2018, the contents of which is incorporated herein by reference.

Description of Related Art

A dielectric breakdown field of silicon carbide (SiC) is ten times greater than that of silicon (Si), and a bandgap thereof is three times greater than that of silicon. In addition, silicon carbide (SiC) has characteristics of thermal conductivity nearly three times higher than that of silicon (Si). It is expected that silicon carbide (SiC) is applied to a power device, a high frequency device, or a high-temperature operation device.

A SiC epitaxial wafer obtained by forming an epitaxial film on a SiC wafer is used in a device such as a semiconductor. The epitaxial film provided on the SiC wafer by chemical vapor deposition (CVD) becomes an active region of a SiC semiconductor device. The SiC wafer is obtained by processing a SiC ingot.

The SiC ingot is obtained by performing a crystal growth of a seed crystal by a method such as a sublimation-recrystallization method. In the sublimation method, in a case where a difference in temperature occurs between a SiC source and a growth surface, a SiC source gas sublimated from the SiC source is efficiently supplied to the growth surface, and a crystal growth is promoted. However, the growth surface faces the SiC source and receives radiation from the SiC source. Accordingly, it was difficult to make a difference in temperature between the SiC source and the growth surface.

Patent document 1 discloses that a shielding member is provided between a SiC source and a growth surface. The radiation from the SiC source to the growth surface is prevented by the shielding member, and a difference in temperature occurs between the SiC source and the growth surface.

CITATION LIST

Patent Documents

Patent document 1: Japanese Unexamined Patent Application, First Publication No. 2000-264795

SUMMARY OF THE INVENTION

In recent years, a demand for a large-sized (6 inches or greater) SiC wafer increases. For example, in a case where a large-sized Sic ingot is manufactured by using the shielding member shown in Patent document 1, it is necessary to use a shielding member having a large diameter. However, the shielding member having a large diameter inhibits a flow of a SiC source gas. In a case where the SiC source gas is hardly supplied to the center of the growth surface, a homogenous crystal growth is inhibited.

The invention is made in circumstances of the problems described above, and an object thereof is to provide a shielding member capable of preventing inhibition of a flow of a SiC source gas and generating a difference in temperature between a SiC source surface and a growth surface, and an apparatus for single crystal growth including the same.

That is, the invention provides the following means for solving the problems.

(1) A shielding member according to a first aspect that is a shielding member, which is placed between a SiC source loading portion and a crystal installation portion in an apparatus for single crystal growth, wherein the apparatus for single crystal growth includes a crystal growth container including the SiC source loading portion which accommodates a SiC source in an inner bottom portion, and the crystal installation portion facing the SiC source loading portion, and a heating unit that is configured to heat the crystal growth container, and wherein the apparatus for single crystal growth grows a single crystal of the SiC source on a crystal installed on the crystal installation portion by sublimating the SiC source from the SiC source loading portion, the shielding member includes: a plurality of shielding plates, in which each area of the plurality of shielding plates is 40% or less of a base area of the crystal growth container, and wherein, in a case where the SiC source loading portion is filled with a SiC source, a shielding ratio provided by a projection surface of the plurality of shielding plates, which is projected on an internal circle of the SiC source loading portion at SiC source surface, is 0.5 or more.

(2) In the shielding member according to the aspect, at least one of the plurality of shielding plates may be positioned at a height which is different from the height of the other shielding plates.

(3) In the shielding member according to the aspect, the plurality of shielding plates may be connected to each other.

(4) An apparatus for single crystal growth according to a second aspect includes the shielding member according to the first aspect.

(5) The aforementioned apparatus for single crystal growth preferably includes: a crystal growth container including a SiC source loading portion which accommodates a SiC source in an inner bottom portion, and a crystal installation portion which faces the SiC source loading portion; and a heating unit that is configured to heat the crystal growth container, in which the shielding member is placed between the SiC source loading portion and the crystal installation portion, and wherein a single crystal of the SiC source is grown on a crystal, which is disposed on the crystal installation portion, by sublimating the SiC source from the SiC source loading portion.

Effects of Invention

According to the shielding member according to the above aspects, it is possible to efficiently prevent radiation from a SiC source surface, while ensuring each gap between shielding plates as a flow path of a SiC source gas.

DETAILED DESCRIPTION OF THE INVENTION

Hereinafter, embodiments of the present invention will be described in detail with reference to suitable drawings. Regarding the drawings used in the following description, a part of feature may be enlarged for convenience and a dimensional ratio of each constituent element or the like may be different from actual value. Substances or dimensions shown in the following description are merely an example, the invention is not limited thereto, and these can be suitably changed within a range not changing the gist thereof.

Unless otherwise noted, the number, the size, the position, the material, the ratio, or the shape and the like may be changed, added, or omitted, if necessary. Preferred conditions or example in First Example and Second Example may be combined with each other.

First Embodiment

Apparatus for Single Crystal Growth

Figure 1:
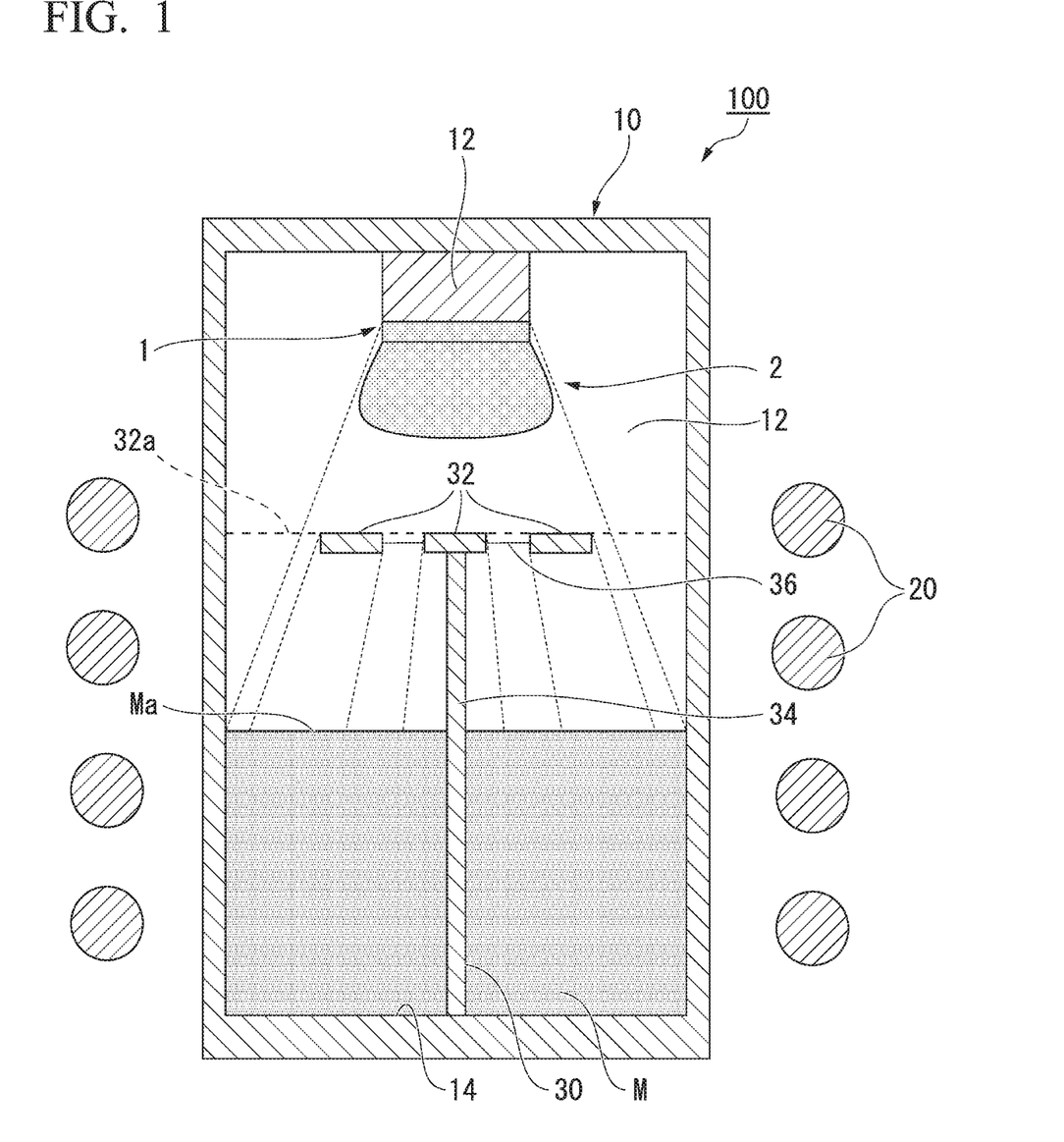
FIG. 1 is a schematic sectional view showing a preferred example of an apparatus for single crystal growth according to a first embodiment.

FIG. 1 is a schematic sectional view showing a preferred example of an apparatus for single crystal growth according to the first embodiment. In FIG. 1, for easy understanding, a SiC source M, a seed crystal 1, and a single crystal 2 are shown at the same time. An apparatus for single crystal growth 100 shown in FIG. 1 includes a crystal growth container 10, a coil (heating unit) 20, and a shielding member 30.

The crystal growth container 10 includes a space therein. Toward an inner bottom surface of the crystal growth container 10, the SiC source M is filled. The inner bottom surface of the crystal growth container 10 forms a SiC source loading portion 14. A crystal installation portion 12 is provided at a position facing the SiC source M filled in the SiC source loading portion 14. The crystal installation portion 12 is a portion where the seed crystal 1 is installed. For example, the crystal installation portion 12 is protruded in a columnar shape to the SiC source M, at the center position seen from the SiC source M side. As the crystal installation portion 12, a carbon material such as graphite can be preferably used.

The coil 20 covers an outer periphery of the crystal growth container 10. In a case where a current flows into the coil 20, the coil 20 generates heat and functions as a heater. In a case where the SiC source M is heated by the coil 20, the SiC source M is sublimated, and the single crystal 2 is grown on a growth surface of the seed crystal 1. A heating member other than the coil may be used as the heating unit, instead of the coil.

The shielding member 30 is positioned between the SiC source loading portion 14 and the crystal installation portion 12. The shielding member 30 includes a plurality of shielding plates 32, a support 34, and a connecting portion 36. The member of the shielding member 30 can be randomly selected and, for example, graphite or tantalum carbide can be used.

Figure 2:
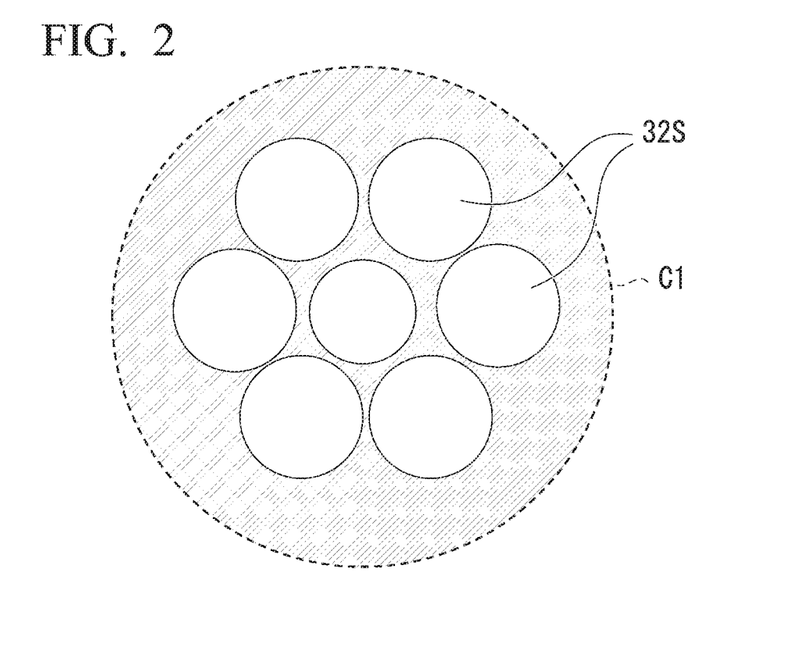
FIG. 2 is a view wherein a shielding member according to the first embodiment is projected on an internal circle of a SiC source loading portion at a SiC source surface, wherein the SiC source loading portion is filled with a SiC source.

A shielding ratio of a projection surface (projection image) 32S of the plurality of shielding plates 32 is equal to or greater than 0.5, when the shielding plates are projected on an internal circle of the SiC source loading portion at a SiC source surface Ma, which shows a position where the SiC source loading portion 14 is filled with the SiC source M. The shielding ratio may be a percentage of the area of the projection surface 32S with respect to the area of the internal circle. FIG. 2 is a view wherein the shielding member according to the first embodiment is projected on the SiC source surface, wherein the SiC source loading portion is filled with the SiC source. In FIG. 2, an inner space of the crystal growth container 10 has a circular shape in a plan view. The shielding ratio may be obtained by assuming a cone having the internal circle as a bottom surface and a side surface passing through an outer periphery of an installation surface of the crystal installation portion. An apex of the cone is considered as a light source and the shielding ratio may be obtained by projecting the shielding plates towards the internal circle.

The SiC source surface Ma is specified, even in a state where the SiC source M is not filled. The SiC source surface Ma means a position that is 30% of a height of the inner space from the bottom surface of the inner space of the crystal growth container 10. The height of the inner space can be set at the time of design, if necessary.

The shielding ratio means an area ratio of a total area of the projection surfaces 32S which are shadows of the plurality of shielding plates 32, in a case where the light source is installed on the crystal installation portion 12, with respect to an area of the internal circle C1 included in the crystal growth container 10 at the SiC source surface Ma. The internal circle C1 included in the crystal growth container 10 is a circle of a cylinder in a plan view, in a case where the shape of the space formed in the crystal growth container 10 is a cylindrical shape. In a case where the shape of the space formed in the crystal growth container 10 is a rectangular shape, the internal circle C1 is a circle included in a square, in a plan view of the rectangle.

The shielding ratio may be obtained by actual projection, or may be obtained as a shielding ratio converted as described below. First, the area of a specified circle provided at a first surface 32a, where the plurality of shielding plates 32 are present, is found. The area of the specified circle of the first surface 32a corresponds to an area of a cross section of a truncated cone, when the cone is cut at the position of the first surface 32a, wherein the truncated cone is obtained by connecting the crystal installation portion 12 and the internal circle C1 at the SiC source surface Ma. Next, a total area of the plurality of shielding plates 32 is obtained. A value obtained by dividing the total area of the plurality of shielding plates 32 by the area of the specified circle of the first surface 32a is the converted shielding ratio.

The specified circle of the first surface 32a and the internal circle C1 at the SiC source surface Ma have similar shapes. Accordingly, a relationship between the total area of the plurality of shielding plates 32 and the area of the specified circle of the first surface 32a, and a relationship between the total area of the projection surface 32S of the plurality of shielding plates 32 and the area of the internal circle C1 at the SiC source surface Ma correspond to each other. That is, the converted shielding ratio at the first surface 32a corresponds to the shielding ratio to be obtained.

In a case where the shielding ratio of the projection surface 32S obtained from the plurality of shielding plates 32 is equal to or greater than 0.5, it is possible to prevent radiation from the SiC source M from achieving the growth surface of the single crystal 2, and to generate a difference in temperature between the SiC source surface and the growth surface. In addition, the shielding ratio of the projection surface 32S obtained from the plurality of shielding plates 32 is preferably equal to or greater than 0.6, and more preferably equal to or greater than 0.7.

In addition, the shielding ratio of the projection surface 32S obtained due to the plurality of shielding plates 32 can be randomly selected, and is preferably equal to or smaller than 0.9. In a case where the shielding ratio of the projection surface 32S obtained from the plurality of shielding plates 32 is equal to or smaller than 0.9, the SiC source gas sublimated from the SiC source M can be efficiently supplied to the single crystal 2. The shielding ratio may be equal to or smaller than 0.8 or equal to or smaller than 0.7, if necessary.

Each area of the plurality of shielding plates 32 can be randomly selected, and is preferably 40% or less of the area of the inner bottom surface (base area) of the crystal growth container 10. By providing the plurality of shielding plates 32 and setting each area thereof to be equal to or smaller than a predetermined value, unevenness in concentration of the sublimating gas approaching the single crystal 2 is prevented, and the growth speed in an in-plane direction of the single crystal 2 becomes even.

Figure 3:
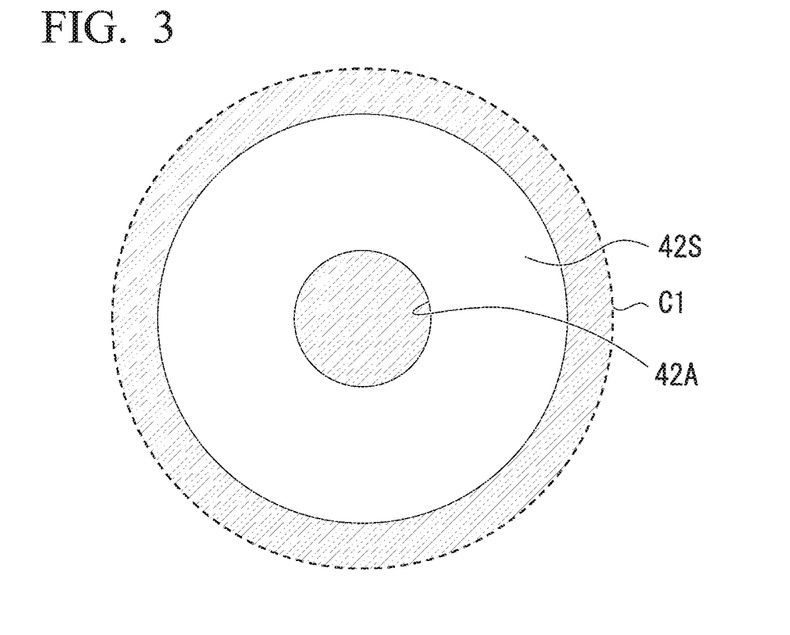
FIG. 3 is a view wherein one shielding plate including an opening therein is projected on an internal circle of a SiC source loading portion at a SiC source surface, wherein the SiC source loading portion is filled with a SiC source.

FIG. 3 is a view wherein one doughnut-shaped shielding plate including an opening therein is projected on the internal circle at the SiC source surface Ma, wherein the SiC source loading portion 14 has been filled with the SiC source. As shown in FIG. 3, the shielding ratio of a projection surface 42S is equal to or greater than 0.5, wherein the projection surface is provided by projection on the internal circle at the SiC source surface Ma, where the SiC source loading portion 14 is filled with the SiC source. Meanwhile, the shielding plate is different from the plurality of shielding plates 32 shown in FIGS. 1 and 2, in that the number of the shielding plate is one, and the area thereof is the size equal to or greater than the predetermined value described above, that is, the area thereof is 40% or more of the area of the inner bottom surface.

As shown in FIG. 3, the projection surface 42S of the shielding plate includes one opening 42A at the center, the radiation from the SiC source M, which is located in the opening 42A, cannot be inhibited. A temperature of the single crystal 2 becomes high at the center in the in-plane direction and becomes low at the outer periphery portion, due to the effect of the radiation. In addition, the sublimating gas passes through the opening at the center and the outer side of the shielding member and is supplied to the single crystal 2. Accordingly, the concentration of the sublimating gas is not supplied evenly into the growth surface. In a case where the temperature of the single crystal 2 and the concentration of the supplied sublimating gas is different in the in-plan direction, a difference is generated in a crystal growth speed, and it is difficult to manufacture the homogeneous single crystal 2.

With respect to this, the shielding member 30 according to the present embodiment includes the plurality of shielding plates 32 having each area equal to or smaller than the predetermined value. Accordingly, it is possible to freely dispose the plurality of shielding plates 32, prevent an unevenness in radiation and the sublimating gas approaching the single crystal 2, and homogenously growing the single crystal 2.

Each area of the plurality of shielding plates 32 can be optionally selected, and is more preferably 30 or less of the area of the inner bottom surface of the crystal growth container 10, and even more preferably 20% or less of the area of the inner bottom surface of the crystal growth container 10. In addition, each area of the projection surfaces 32S of the plurality of shielding plates 32 is preferably 30% or less of the area of the inner bottom surface of the crystal growth container 10, and more preferably 20% or less of the area of the inner bottom surface of the crystal growth container 10. The lower limit value of the area of the shielding plate 32 can be randomly selected and may be, for example, 3% or more or 5% or more.

The shielding plates 32 are preferably arranged at regular intervals. In addition, the disposition of the shielding plates 32 can be randomly selected, and the shielding plates 32 are more preferably located to have a hexagonal close-packed structure or a structure of a part thereof. Specific examples thereof include, in a plan view, a structure in which the shielding plates 32 are placed at each corner and the center of a regular hexagon, and a structure in which the shielding plates 32 are placed at each corner of an equilateral triangle. By arranging the shielding plates 32 at regular intervals, it is possible to further prevent an unevenness in radiation approaching the single crystal 2 and equalize the temperature of the single crystal 2. In addition, it is possible to increase symmetry of a flow of the SiC source gas supplied to the growth surface of the single crystal 2. Further, the number of total shielding plates 32 can be randomly selected. For example, the number thereof may be 2 to 16, 3 to 12, or 4 to 8, but is not limited thereto. Shapes and/or sizes of all of the shielding plates 32 may be the same as or different from each other. The shielding plates may have, for example, a circular shape, a hexagonal shape, a fan-shape or the like. All of the shielding plates may have the same shape.

Figure 4:
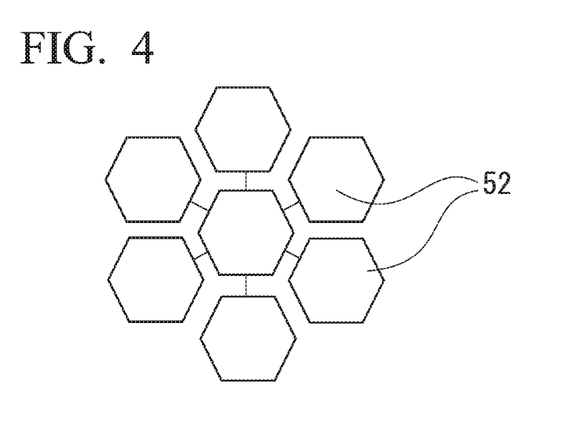
FIG. 4 is a schematic view of another example of the shielding member according to the first embodiment.
Figure 5:
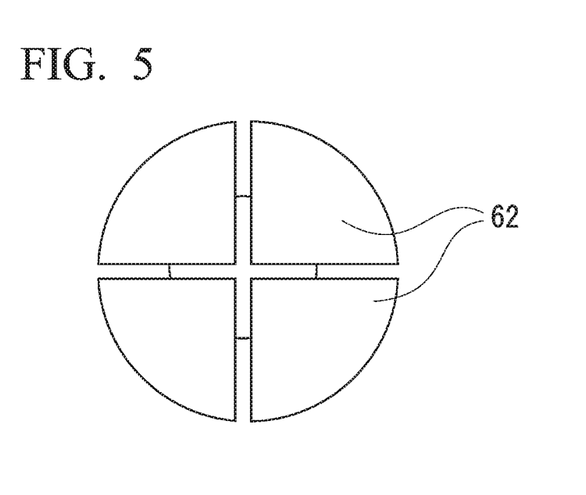
FIG. 5 is a schematic view of still another example of the shielding member according to the first embodiment.

FIGS. 4 and 5 are schematic view of another example of the shielding member according to the first embodiment. Shielding plates 52 shown in FIG. 4 are different from the shielding plates 32 shown in FIG. 2, in a point that each shape thereof is a hexagon. The shielding plates 62 shown in FIG. 5 are different from the shielding plate 32 shown in FIG. 2, in a point that each shape thereof is a fan shape. As shown in FIG. 4, in a case where the hexagonal shielding plates 52 are filled in a hexagonal closest manner, the shielding ratio of the shielding plates increases.

The plurality of shielding plates 32 shown in FIG. 1 are connected to each other by the connecting portion 36. The plurality of shielding plates 32 can be integrated by the connecting portion 36 for easy handling. In addition, the number of supports 34 can be decreased. In a case where the support 34 is provided at the center in a plan view, symmetry of the flow of the SiC source gas supplied to the growth surface of the single crystal 2 becomes high.

The SiC source surface Ma may be fixed or may be changed, if necessary, in order to obtain a preferred shielding ratio. That is, the depth of the container may be adjusted. The length of the support 34 exposed from the SiC source may also be fixed, or a preferred length may be selected, if necessary. The size, the number, and/or the position of the shielding plates 32 can be selected, and accordingly, a condition for obtaining a preferred shielding ratio may be selected with a combination of the condition of the shielding plates and the length, the position and the like thereof.

As described above, according to the shielding member according to the embodiment, a suitable gap can be provided between the plurality of shielding plates 32, and the SiC source gas can be efficiently supplied to the crystal installation portion 12 from the SiC source loading portion 14. In addition, as a degree of freedom of the disposition of the plurality of shielding plates increases, it is possible to prevent an unevenness in radiation approaching the single crystal 2 and equalize the temperature of the single crystal 2.

Second Embodiment

Apparatus for Single Crystal Growth

Figure 6:
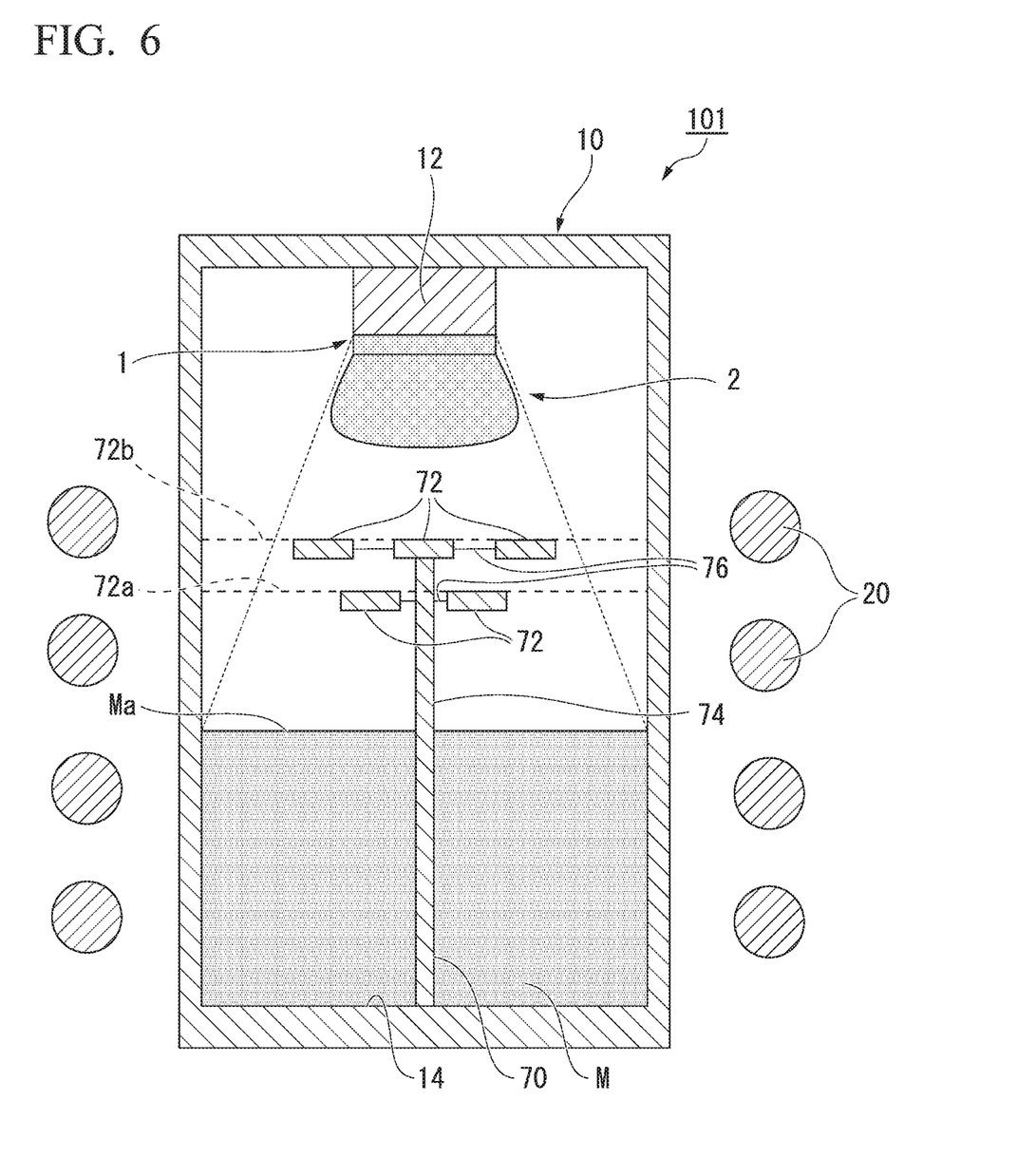
FIG. 6 is a schematic sectional view showing a preferred example of an apparatus for single crystal growth according to a second embodiment.

FIG. 6 is a schematic sectional view of an apparatus for single crystal growth according to a second embodiment. In FIG. 6, for easy understanding, a SiC source M, a seed crystal 1, and a single crystal 2 are shown at the same time. An apparatus for single crystal growth 101 shown in FIG. 6 includes a crystal growth container 10, a coil (heating unit) 20, and a shielding member 70. A shape of the shielding member 70 is different from that of the apparatus for single crystal growth 100 shown in FIG. 1. The other configurations are the same, the same reference numerals are used for those, and therefore, the description thereof is omitted.

Figure 7:
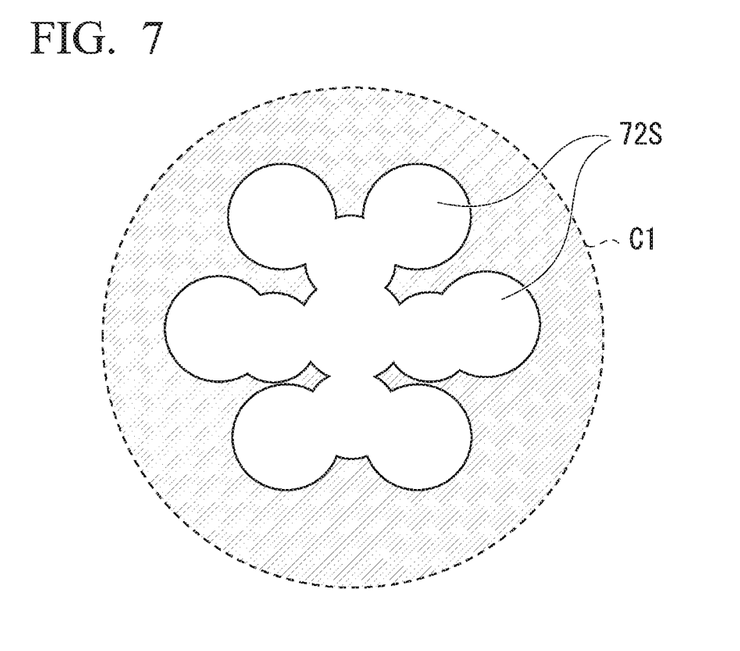
FIG. 7 is a view wherein the shielding member according to the second embodiment is projected on an internal circle of a SiC source loading portion at a SiC source surface, wherein the SiC source loading portion is filled with a SiC source.

The shielding member 70 includes a plurality of shielding plates 72, a support 74, and a connecting portion 76. It is different from the shielding member 30 shown in FIG. 1, in a point that the plurality of shielding plates 72 are provided as two stages. FIG. 7 is a view wherein the shielding member 70 according to the second embodiment is projected at the SiC source surface Ma, where the SiC source loading portion 14 is filled with the SiC source M. In this example, the number of stages is two, but there is no limitation to the number of stages.

A shielding ratio of a projection surface 72S is equal to or greater than 0.5, when the plurality of shielding plates 72 are projected on the internal circle of the SiC source loading portion at the SiC source surface Ma, in a case where the SiC source loading portion 14 is filled with the SiC source M. The shielding ratio of the projection surface 72S of the plurality of shielding plates 72 is preferably equal to or greater than 0.6 and more preferably equal to or greater than 0.7.

Figure 8:
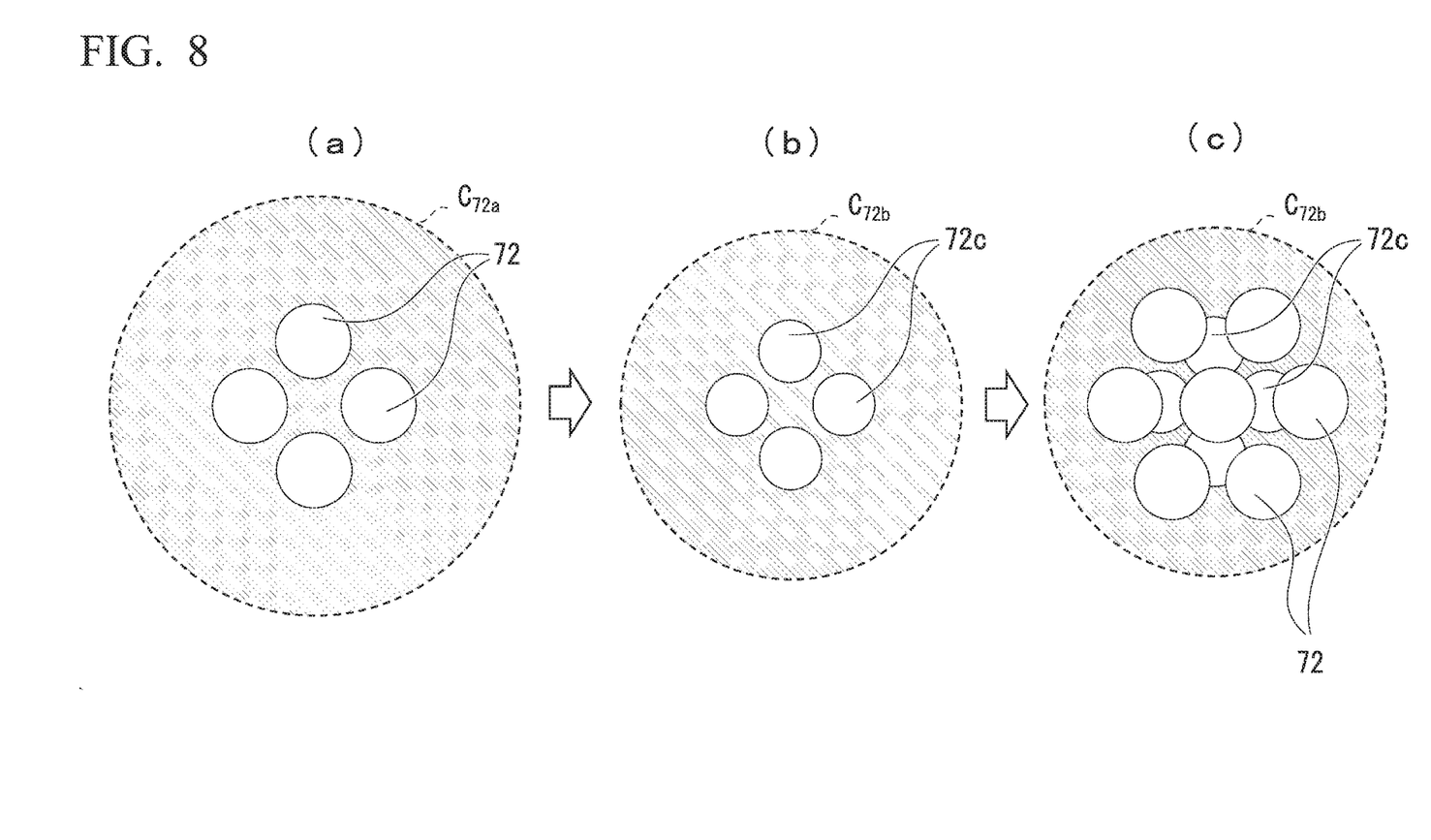
FIG. 8 is a schematic view for describing a converted shielding ratio of the shielding member according to the second embodiment.

The converted shielding ratio, in a case where at least one of the plurality of shielding plates 72 is positioned at a height different from that of the other shielding plates, can be obtained in the following procedure. FIG. 8 is a schematic view for describing the converted shielding ratio of the shielding member according to the second embodiment. By performing the conversion of the size of the shielding plates and/or the specified circle, it is possible to perform the calculation by assuming that the shielding plates are positioned at one height.

First, a first specified circle $C_{72a}$ including the surface of the first shielding plates 72 is set. The first specified circle $C_{72a}$ corresponds to a cross section obtained by cutting a truncated cone, wherein the cone is obtained by connecting the crystal installation portion 12 and the internal circle C1 at the SiC source surface Ma, by a first surface 72a. The first surface 72a is a surface where a surface of the shielding plates 72, which are positioned on the most SiC source side of the plurality of shielding plates 72, is present, and is a surface orthogonal to the vertical line drawn down from the crystal installation portion 12 to the SiC source loading portion 14. In the first specified circle $C_{72a}$, the surface of the shielding plates 72 (first shielding plates) positioned at a height of the first surface 72a is present ((a) of FIG. 8).

Next, the size of the shielding plates 72 positioned at the first stage is converted. That is, the size of the first specified circle $C_{72a}$ and the shielding plates 72 positioned at the height of the first surface 72a is converted into a size of a second specified circle $C_{72b}$. The second specified circle $C_{72b}$ includes a surface of the shielding plates 72 at a second stage. The second specified circle $C_{72b}$ corresponds to a cross section of a truncated cone cut by the second surface 72b, wherein the cone is obtained by connecting the crystal installation portion 12 and the internal circle C1 on the SiC source surface Ma. The second surface 72b is a surface on which the surface of the shielding plates 72, which are positioned next closest to the SiC source side after the shielding plates 72 present at the height of the first surface 72a among the plurality of shielding plates 72, is present. In addition, the second surface 72b is a surface orthogonal to a vertical line drawn down from the crystal installation portion 12 to the SiC source loading portion 14.

The conversion of the size into the second specified circle $C_{72b}$ is performed based on a difference in diameters of the first specified circle $C_{72a}$ and the second specified circle $C_{72b}$. In the conversion, the size of the first specified circle $C_{72a}$ is reduced to the size of the second specified circle $C_{72b}$. At the same time, the shielding plates 72 positioned at the height of the first surface 72a is also transitioned to be positioned at the height of the second surface 72b, and the size thereof is reduced. The shielding plates 72 transitioned to the position at the height of the second surface 72b is referred to as a transitioned shielding plates 72c, hereinafter. The ratio of the area of the first specified circle $C_{72a}$ and a total area of the shielding plates 72 positioned at the height of the first surface 72a coincides with a ratio of the area of the second specified circle $C_{72b}$ and the relationship of the total area of the transitioned shielding plates 72c ((b) of FIG. 8).

Finally, the shielding plates 72 positioned at the height of the second surface 72b is superimposed on the second specified circle Cub including the transitioned shielding plates 72c ((c) of FIG. 8). A value obtained by dividing a total area of the plurality of shielding plates 72 and the plurality of transitioned shielding plates 72c by the area of the second specified circle $C_{72b}$ is the converted shielding ratio. With respect to the overlapped portion of the plates, the area of the shielding plates at the top stage is used for the total area. The second specified circle $C_{72b}$ and the internal circle C1 at the SiC source surface Ma have similar shape to each other. Accordingly, the converted shielding ratio corresponds to the shielding ratio to be obtained.

Each area of the plurality of shielding plates 72 is preferably 40% or less of the area of the inner bottom surface of the crystal growth container 10, and is more preferably 30% or less of the area of the inner bottom surface of the crystal growth container 10. The lower limit value of the area of the shielding plates 72 can be randomly selected, and the ratio may be, for example, 3% or more or 5% or more. In addition, each diameter of the plurality of shielding plates 72 is preferably 30% or less of a diameter of a circle having the area of the inner bottom surface of the crystal growth container 10. Further, each area of the projection surface 72S of the plurality of shielding plates 72 is preferably 30% or less of the area of the inner bottom surface of the crystal growth container 10, and more preferably 20% or less of the area of the inner bottom surface of the crystal growth container 10.

The shielding plates 72 positioned at the height of the first surface 72a and the shielding plates 72 positioned at the height of the second surface 72b are preferably arranged at regular intervals, respectively. In addition, the plurality of shielding plates 72 preferably have a hexagonal close-packed structure as a whole. As a specific example, a structure in which the shielding plates 72 are placed at each corner and the center of a regular hexagon, a structure in which the shielding plates 72 are placed at each corner of an equilateral triangle, or a structure in which the shielding plates 72 are placed at each corner of a square may be combined, if necessary. In these structures, the shielding plates may be disposed at different stages so that the center coincides in a plan view.

The plurality of shielding plates 72 shown in FIG. 7 are connected to each other through the connecting portion 76. The plurality of shielding plates 72 are integrated by the connecting portion 76 for easy handling. In addition, the number of supports 74 can be decreased. In a case where the support 74 is provided at the center in a plan view, symmetry of the flow of the SiC source gas supplied to the growth surface of the single crystal 2 becomes high. In addition, the shape of the shielding plates 72 is not particularly limited.

As described above, according to the shielding member according to the embodiment, a suitable gap can be provided between the plurality of shielding plates 72, and the SiC source gas can be efficiently supplied to the crystal installation portion 12 from the SiC source loading portion 14. In addition, as a degree of freedom of the disposition of the plurality of shielding plates increases, it is possible to prevent an unevenness in radiation approaching the single crystal 2 and equalize the temperature of the single crystal 2.

In addition, at least one of the plurality of shielding plates 72 may be positioned at a height which is different from that of the other shielding plates 72, and accordingly, a flow path of the SiC source gas sublimated from the SiC source M is easily ensured while increasing the shielding ratio.

Hereinabove, examples of the preferred embodiment of the invention have been described, but the invention is not limited to the embodiments, and various changes and modifications can be performed within a range of the gist of the invention shown in the claims.

EXAMPLES

Example 1

First, a crystal growth container including a columnar inner space therein was prepared. The crystal growth container was filled with SiC powder as a SiC source to a position of 30% of a height of the inner space from an inner bottom surface. A crystal installation portion was set as to have a circular shape having a diameter of 6 inches.

A shielding member was provided between the SiC source and the crystal installation portion. The shielding member is configured with three shielding plates having a circular shape in a plan view, and the shielding plates were arranged on the same flat surface, by hexagonal close disposition, that is, so that each distance becomes equal by using a support as the center. Each area of the shielding plates was set as 17% of the area of the inner bottom surface of the crystal growth container. In addition, a height at which the shielding plates were placed was designed so that a shielding ratio of a projection surface, where the plurality of shielding plates were projected at a SiC source surface corresponding to the outermost surface of the SiC source, was 0.5.

A seed crystal was installed on the crystal installation portion to perform crystal growth of a Sic ingot of 6 inches. The SiC ingot which was crystal-grown under the condition of Example 1 was excellent crystal, without other polytype inclusion and generation of cracks.

Example 2

Example 2 is different from Example 1, in a point that the shielding plates are placed at different height positions with a two-stage configuration. Three shielding plates having a circular shape in a plan view were arranged on a first surface on the SiC source side, and three shielding plates having a circular shape in a plan view were arranged on a second surface at a position far from the SiC source, so as to have a hexagonal close-packed structure. That is, the shielding plates were placed at apexes of an equilateral triangle at regular intervals, and were placed so that the shielding plates on the second surface were respectively placed between the shielding plates on the first surface, in a plan view. A shielding ratio of a projection surface on which the plurality of shielding plates were projected at a SiC source surface corresponding to the outermost surface of the SiC source was 0.72. A height at which the shielding plates are placed is designed so as to obtain the shielding ratio described above. The other conditions were the same as those in Example 1. The SiC ingot which was crystal-grown under the condition of Example 2 was excellent crystal, without other polytype inclusion and generation of cracks.

Comparative Example 1

In Comparative Example 1, the growth was carried out without using the shielding member. The other conditions were the same as those in Example 1. In the SiC ingot which was crystal-grown under the condition of Comparative Example 1, a plurality of heterogeneous polymorphic crystals were confirmed. It is thought that this is because a temperature during the crystal growth has increased.

Comparative Example 2

In Comparative Example 2, in the same locations as in Example 1, the size of the shielding plates was reduced and the shielding ratio was set as 0.18. In the SiC ingot which was crystal-grown under the condition of Comparative Example 2, a plurality of heterogeneous polymorphic crystals were generated. It is thought that this is because the shielding effect of the shielding member is insufficient and the temperature of crystal has excessively increased.

Comparative Example 3

In Comparative Example 3, the shielding member as shown in FIG. 3 was designed with a single plate, and the shielding ratio was set as 0.72. On the SiC ingot which was crystal-grown under the condition of Comparative Example 3, cracks were generated. It is thought that this is because the supply of gas to the shield surface of the seed crystal is not homogeneously performed and the growth crystal shape is distorted.

The results described above are summarized in Table 1.

TABLE 1

| | Shielding member | | Grown crystal | |
|---|---|---|---|---|
| | Shielding ratio | Number | Other polytype inclusion | Generation of cracks |
| Comparative Example 1 | 0 | — | Observed | Not observed |
| Comparative Example 2 | 0.18 | Plural | Observed | Not observed |
| Example 1 | 0.50 | Plural | Not observed | Not observed |
| Example 2 | 0.72 | Plural, multiple stage | Not observed | Not observed |
| Comparative Example 3 | 0.72 | Single plate | Not observed | Observed |

INDUSTRIAL APPLICABILITY

The present invention can provide a shielding member capable of preventing inhibition of a flow of a SiC source gas and generating a difference in temperature between SiC source surface and a growth surface, and a single crystal growth device including the same.

EXPLANATION OF REFERENCES

1: seed crystal
2: single crystal
10: crystal growth container
12: crystal installation portion
14: SiC source loading portion
20: coil
30: shielding member
32, 52, 62, 72: shielding plate
32a, 72a: first surface
72b: second surface
72c: transitioned shielding plate
32S, 42S, 72S: projection surface
42A: opening
34, 74: support
36, 76: connecting portion
100: apparatus for single crystal growth
M: SiC source
Ma: SiC source surface
C1: internal circle
$C_{72a}$: first specified circle
$C_{72b}$: second specified circle

The invention claimed is:

1. A shielding member, which is placed between a SiC source loading portion and a crystal installation portion in an apparatus for single crystal growth,
    wherein
        the apparatus for single crystal growth includes
            a crystal growth container including
                the SiC source loading portion which accommodates a SiC source in an inner bottom portion, and
                the crystal installation portion facing the SiC source loading portion, and
            a heating unit that is configured to heat the crystal growth container, and wherein
        the apparatus for single crystal growth grows a single crystal of the SiC source on a crystal installed on the crystal installation portion by sublimating the SiC source from the SiC source loading portion,
    the shielding member comprising:
        a plurality of shielding plates, wherein
        the shielding plates are arranged on a same plane,
        each area of the plurality of shielding plates is 40% or less of a base area of the crystal growth container, and wherein,
        in a case where the SiC source loading portion is filled with a SiC source, a shielding ratio provided by a projection surface of the plurality of shielding plates, which is projected on an internal circle of the SiC source loading portion at SiC source surface, is 0.5 or more and is equal to or smaller than 0.9, and
        wherein the shielding member further includes
        a connection portion and
        a support which extends from an inner bottom surface of the SiC source loading portion,
        wherein the shielding plates are integrated by the connecting portion, and the integrated shielding plates are supported by the support.

2. An apparatus for single crystal growth comprising:
    a first shielding member according to claim 1,
    a crystal growth container including
        a SiC source loading portion which accommodates a SiC source in an inner bottom portion, and
        a crystal installation portion which faces the SiC source loading portion; and
    a heating unit that is configured to heat the crystal growth container,
    wherein the shielding member is placed between the SiC source loading portion and the crystal installation portion, and
    wherein
    a single crystal of the SiC source is grown on a crystal, which is disposed on the crystal installation portion, by sublimating the SiC source from the SiC source loading portion.

3. The shielding member according to claim 1, wherein the plurality of shielding plates are connected to each other.

4. The apparatus according to claim 2, which further comprises at least one shielding plate positioned at a height which is different from a height of the shielding plates of the first shielding member.

5. The shielding member according to claim 1, wherein all of the shielding plates have a circular shape.

6. The shielding member according to claim 1, wherein all of the shielding plates have a hexagonal shape.

7. The shielding member according to claim 1, wherein all of the shielding plates have a fan shape.

8. The shielding member according to claim 1, wherein the shielding ratio provided by the projection surface is equal to or greater than 0.6.

9. The shielding member according to claim 1, wherein the shielding ratio provided by the projection surface is equal to or greater than 0.7.

10. The shielding member according to claim 1, wherein each projection surface area of the shielding plates is 30% or less of an area of an inner bottom surface of the crystal growth container.

11. The shielding member according to claim 1, wherein each projection surface area of the shielding plates is 20% or less of an area of an inner bottom surface of the crystal growth container.

12. The shielding member according to claim 1,
wherein the shielding plates are arranged in a hexagonal close-packed structure.

13. The shielding member according to claim 1,
wherein, in a plan view, the shielding plates are placed at regular intervals, such that the shielding plates are placed at each corner and the center of a regular hexagon.

14. The shielding member according to claim 1,
wherein, in a plan view, the shielding plates are placed at regular intervals, such that the shielding plates are placed at each corner of an equilateral triangle.

15. The shielding member according to claim 1,
wherein the shielding plates are placed with a two-stage configuration.

16. The shielding member according to claim 1,
wherein the shielding plates consist of flat plates which are horizontally arranged at a same height.

17. The shielding member according to claim 1,
wherein the shielding plates consist of flat plates including no opening therein.

18. The shielding member according to claim 1,
wherein a peripheral edge of each of the shielding plates is offset from an inner surface of the crystal growth container.

19. The shielding member according to claim 1,
wherein the crystal installation portion has a circular shape having a diameter of 6 inches.

20. The apparatus for single crystal growth according to claim 4,
wherein the crystal installation portion has a circular shape having a diameter of 6 inches.

* * * * *